United States Patent
Ota et al.

(10) Patent No.: US 10,636,906 B2
(45) Date of Patent: Apr. 28, 2020

(54) SEMICONDUCTOR DEVICE INCLUDING FIRST AND SECOND METAL OXIDE SEMICONDUCTOR TRANSISTORS

(71) Applicant: PANASONIC INTELLECTUAL PROPERTY MANAGEMENT CO., LTD., Osaka (JP)

(72) Inventors: Tomonari Ota, Osaka (JP); Shigetoshi Sota, Kyoto (JP); Eiji Yasuda, Osaka (JP); Takeshi Imamura, Kyoto (JP); Toshikazu Imai, Hyogo (JP); Ryosuke Okawa, Nara (JP); Kazuma Yoshida, Kyoto (JP); Masaaki Hirako, Shiga (JP); Dohwan Ahn, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/854,220

(22) Filed: Dec. 26, 2017

(65) Prior Publication Data
US 2018/0122939 A1 May 3, 2018

Related U.S. Application Data

(63) Continuation of application No. PCT/JP2016/003133, filed on Jun. 30, 2016.

(30) Foreign Application Priority Data

Jul. 1, 2015 (JP) .................................. 2015-132819

(51) Int. Cl.
H01L 29/78 (2006.01)
H01L 27/088 (2006.01)
(Continued)

(52) U.S. Cl.
CPC .. *H01L 29/7827* (2013.01); *H01L 21/823475* (2013.01); *H01L 21/823487* (2013.01);
(Continued)

(58) Field of Classification Search
None
See application file for complete search history.

(56) References Cited

U.S. PATENT DOCUMENTS

2001/0045635 A1 11/2001 Kinzer et al.
2002/0113276 A1 8/2002 Magri' et al.
(Continued)

FOREIGN PATENT DOCUMENTS

JP 2000-058829 A 2/2000
JP 2002-368218 A 12/2002
(Continued)

OTHER PUBLICATIONS

International Search Report and Written Opinion issued in International Patent Application No. PCT/JP2016/003133, dated Sep. 27, 2016; with partial English translation.

*Primary Examiner* — Nilufa Rahim
(74) *Attorney, Agent, or Firm* — McDermott Will & Emery LLP

(57) ABSTRACT

A semiconductor device in chip size package includes first and second metal oxide semiconductor transistors both vertical transistors formed in first and second regions obtained by dividing the semiconductor device into halves. The first metal oxide semiconductor transistor includes one or more first gate electrodes and four or more first source electrodes provided in one major surface, each of the first gate electrodes is surrounded, in top view, by the first source electrodes, and for any combination of a first gate electrode and a first source electrode, closest points between the first gate and first source electrodes are on a line inclined to a (Continued)

chip side. The second metal oxide semiconductor transistor includes the same structure as the first metal oxide semiconductor transistor. A conductor that connects the drains of the first and second metal oxide semiconductor transistors is provided in the other major surface of the semiconductor device.

20 Claims, 16 Drawing Sheets

(51) Int. Cl.
*H01L 21/8234* (2006.01)
*H01L 29/423* (2006.01)
*H01L 29/417* (2006.01)
*H01L 23/00* (2006.01)

(52) U.S. Cl.
CPC ............ *H01L 24/47* (2013.01); *H01L 27/088* (2013.01); *H01L 29/41741* (2013.01); *H01L 29/4238* (2013.01)

(56) References Cited

U.S. PATENT DOCUMENTS

| | | | |
|---|---|---|---|
| 2003/0211671 A1* | 11/2003 | Blanchard | ........... H01L 29/0696 438/197 |
| 2007/0215997 A1 | 9/2007 | Standing | |
| 2008/0061326 A1 | 3/2008 | Yoshida et al. | |
| 2013/0320454 A1 | 12/2013 | Suzuki et al. | |
| 2015/0145025 A1* | 5/2015 | Yoshida | .............. H01L 29/7813 257/329 |

FOREIGN PATENT DOCUMENTS

| | | |
|---|---|---|
| JP | 2004-502293 A | 1/2004 |
| JP | 2007-194305 A | 8/2007 |
| JP | 2008-053623 A | 3/2008 |
| JP | 2009-530826 A | 8/2009 |
| JP | 2013-247309 A | 12/2013 |

* cited by examiner

ASPECT RATIO = x/y

SEMICONDUCTOR DEVICE INCLUDING FIRST AND SECOND METAL OXIDE SEMICONDUCTOR TRANSISTORS

CROSS REFERENCE TO RELATED APPLICATIONS

This application is a U.S. continuation application of PCT International Patent Application Number PCT/JP2016/003133 filed on Jun. 30, 2016, claiming the benefit of priority of Japanese Patent Application Number 2015-132819 filed on Jul. 1, 2015, the entire contents of which are hereby incorporated by reference.

BACKGROUND

1. Technical Field

The present disclosure relates to a semiconductor device, and particularly to a semiconductor device in a chip size package (CSP).

2. Description of the Related Art

Up to the present time, CSP semiconductor devices formed of a package equal to or slightly larger than a chip size have been put into practical use. The CSP semiconductor devices are excellent for a high density packaging, and contribute to miniaturization and weight reduction of a set (see, for example, Japanese Unexamined Patent Application Publication No. 2000-58829, and Japanese Unexamined Patent Application Publication No. 2002-368218).

SUMMARY

However, a conventional CSP semiconductor device has a room for improvement due to its smallness in electrical characteristics and reliability of mounting, for instance, reduction in connection resistance of an electrode, prevention of short-circuit between electrodes with different potential, and stable installation on a printed circuit board.

Thus, to cope with the above-mentioned problem, an object of the present disclosure is to provide a CSP semiconductor device superior in electrical characteristics and reliability of mounting.

In order to solve the above-mentioned problem, an aspect of the present disclosure provides a semiconductor device in a chip size package, including a first metal oxide semiconductor transistor and a second metal oxide semiconductor transistor respectively formed in a first region and a second region obtained by dividing the semiconductor device into halves, the first and the second metal oxide semiconductor transistors each being a vertical transistor. The first metal oxide semiconductor transistor includes one or more first gate electrodes and four or more first source electrodes provided in one of major surfaces of the semiconductor device, each of the one or more first gate electrodes is surrounded, in top view, by the four or more first source electrodes among the first source electrodes, and for any combination of one of the one or more first gate electrodes and one of the four or more first source electrodes, closest points between the one of the one or more first gate electrodes and the one of the four or more first source electrodes are on a line inclined with respect to a chip side, the second metal oxide semiconductor transistor includes one or more second gate electrodes and four or more second source electrodes provided in the one of major surfaces of the semiconductor device, each of the one or more second gate electrodes is surrounded, in top view, by the four or more second source electrodes among the second source electrodes, and for any combination of one of the one or more second gate electrodes and one of the four or more second source electrodes, closest points between the one of the one or more second gate electrodes and the one of the four or more second source electrodes are on a line inclined with respect to a chip side, and a conductor that connects a drain of the first metal oxide semiconductor transistor and a drain of the second metal oxide semiconductor transistor is provided in the other of the major surfaces of the semiconductor device.

With this configuration, the closest points between the first source electrode and the first gate electrode, and the closest points between the second source electrode and the second gate electrode are disposed on a line inclined with respect to a chip side. Therefore, as compared with the arrangement in which the closest points are on a line parallel to a chip side, when the size of the electrodes is the same the distance between electrodes can be increased, and thus short-circuit between electrodes can be prevented. Also, when the distance between electrodes is the same, the area of each electrode can be increased, and the connection resistance of each electrode can be reduced. In other words, with this configuration, the trade-off between electrical characteristics (reduction in the connection resistance of each electrode) and reliability of mounting (prevention of short-circuit between electrodes with different potentials) can be improved.

A semiconductor device according to the present disclosure provides a CSP semiconductor device superior in electrical characteristics and reliability of mounting.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
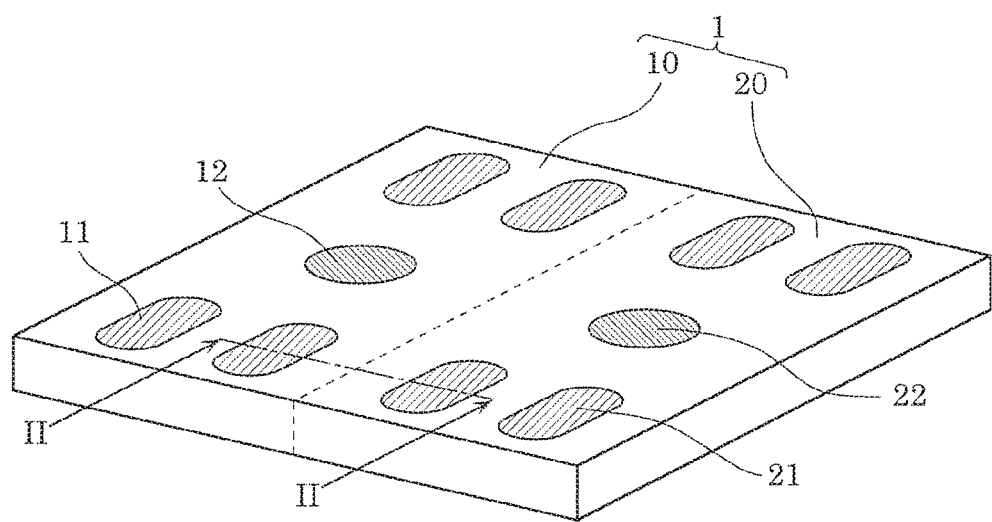
FIG. 1 is a perspective view illustrating an example of the external appearance of a semiconductor device according to a first embodiment.

In order to solve the above-mentioned problem, an aspect of the present disclosure provides a semiconductor device in a chip size package, including a first metal oxide semiconductor transistor and a second metal oxide semiconductor transistor respectively formed in a first region and a second region obtained by dividing the semiconductor device into halves, the first and the second metal oxide semiconductor transistors each being a vertical transistor. The first metal oxide semiconductor transistor includes one or more first gate electrodes and four or more first source electrodes provided in one of major surfaces of the semiconductor device, each of the one or more first gate electrodes is surrounded, in top view, by the four or more first source electrodes among the first source electrodes, and for any combination of one of the one or more first gate electrodes and one of the four or more first source electrodes, closest points between the one of the one or more first gate electrodes and the one of the four or more first source electrodes are on a line inclined with respect to a chip side, the second metal oxide semiconductor transistor includes one or more second gate electrodes and four or more second source electrodes provided in the one of major surfaces of the semiconductor device, each of the one or more second gate electrodes is surrounded, in top view, by the four or more second source electrodes among the second source electrodes, and for any combination of one of the one or more second gate electrodes and one of the four or more second source electrodes, closest points between the one of the one or more second gate electrodes and the one of the four or more second source electrodes are on a line inclined with respect to a chip side, and a conductor that connects a drain of the first metal oxide semiconductor transistor and a drain of the second metal oxide semiconductor transistor is provided in the other of the major surfaces of the semiconductor device.

With this configuration, the closest points between the first source electrode and the first gate electrode, and the closest points between the second source electrode and the second gate electrode are disposed on a line inclined with respect to a chip side. Therefore, as compared with the arrangement in which the closest points are on a line parallel to a chip side, when the size of the electrodes is the same the distance between electrodes can be increased, and thus short-circuit between electrodes can be prevented. Also, when the distance between electrodes is the same, the area of each electrode can be increased, and the connection resistance of each electrode can be reduced. In other words, with this configuration, the trade-off between electrical characteristics (reduction in the connection resistance of each electrode) and reliability of mounting (prevention of short-circuit between electrodes with different potentials) can be improved.

Also, the one or more first gate electrodes, the four or more first source electrodes, the one or more second gate electrodes, and the four or more second source electrodes may be each provided within a stripe-shaped region having a width of a certain value or less in top view.

With this configuration, the width of the electrode is limited to the certain value or less, when the semiconductor device is mounted, a conductive bonding material (for instance, solder) can be easily spread over the entire the electrode, and thus void is unlikely to occur in the conductive bonding material. That is, the reliability of mounting is improved due to reduced void.

Also, the certain value may be 250 μm.

With this configuration, the upper limit of the width for reducing void is defined based on specific results of experiments by the inventors.

Also, the one or more first gate electrodes, the four or more first source electrodes, the one or more second gate electrodes, and the four or more second source electrodes each may have a width of at least 170 μm in top view.

With this configuration, possibility of solder paste remaining (a problem, for instance, the solder paste remains in a stencil and does not adhere to a substrate) reduced, which occurs when a solder paste is stencil printed by an excessively thin pattern. Particularly, defining the lower limit of the width of the electrode as 170 µm is effective for avoiding the solder paste remaining when a standard stencil having a thickness of 80 µm is used based on specific results of experiments by the inventors.

Also, each of the one or more first gate electrodes may be surrounded by four quadrants in each of which corresponding two or more of the first source electrodes may be present, and each of the one or more second gate electrodes may be surrounded by four quadrants in each of which corresponding two or more of the second source electrodes may be present. Also, for each of the one or more first gate electrodes, in each of four quadrants around the first gate electrode of the first region, one or more of the four or more first source electrodes may be present in top view, and an area of each of the one or more of the four or more first source electrodes is greater than an area of the first gate electrode, and for each of the one or more second gate electrodes, in each of four quadrants around the second gate electrode of the second region, one or more of the four or more second source electrodes may be present in top view, and an area of each of the one or more of the four or more second source electrodes is greater than an area of the second gate electrode.

With this configuration, the resistance of a path for the main current can be made lower than the resistance of a path of a control signal, as compared with the case where the same number of first source electrodes and first gate electrodes are provided with the same area, and the same number of second source electrodes and second gate electrodes are provided with the same area. Thus, for instance, when the semiconductor device is a bidirectional transistor, the ON resistance of the bidirectional transistor can be reduced.

Also, the four or more first source electrodes and the four or more second source electrodes each may be formed in an elongated shape, in top view, longer in a direction perpendicular to a boundary between the first region and the second region.

With this configuration, in the case where the longitudinal direction of the first and the second source electrode is parallel to the direction of the shorter side of the chip, the performance of application of underfill is improved, as compared with the case where the longitudinal direction of the first and the second source electrode is parallel to the longer side of the chip. Specifically, the filling performance of a underfill material is improved by reducing the distance of flow of the underfill material.

Also, the four or more first source electrodes and the four or more second source electrodes each may be formed in an elongated shape, in top view, longer in the direction parallel to the boundary between the first region and the second region.

Here, a transistor is designed such that its driving capability is defined by the length of the semiconductor device in the longer side direction using the first and second source electrodes in which the length (the length in the longitudinal direction) is any value, and the width (the width in the transverse direction) has an upper limit (for instance, above-described prevention of void).

In this case, with a configuration in which the transverse direction of the first and second source electrodes is parallel to the longer side direction of the semiconductor device, in order to obtain a desired drive capability, it is necessary to dispose multiple first and second source electrodes side by side according to the width of the first and second source electrodes. In this case, the driving capability obtained becomes discrete, in order to obtain any driving capability, adjustment of the shape and arrangement of the electrodes is necessary.

In contrast, with the above-described configuration, the first and second source electrodes can be arranged for any length in the longer side direction of the semiconductor device by setting the longitudinal direction of the first and second source electrodes in parallel to the longer side direction of the chip. Consequently, it is possible to design the driving capability of the transistor by any continuous quantity, which is useful for streamlined design.

Also, a first active region of the first metal oxide semiconductor transistor and a second active region of the second metal oxide semiconductor transistor may be provided in the first region and the second region, respectively,
at least two of the four or more first source electrodes may be provided in each of one end region and the other end region of the first active region in a direction perpendicular to a boundary between the first region and the second region, and at least two of the four or more second source electrodes may be provided in each of one end region and the other end region of the second active region in a direction perpendicular to the boundary between the first region and the second region.

With this configuration, a current can be passed by effectively utilizing the first and second active regions up to both ends, which is useful for reduction of ON resistance.

Also, a first active region of the first metal oxide semiconductor transistor and a second active region of the second metal oxide semiconductor transistor may be provided in the first region and the second region, respectively, at least two of the four or more first source electrodes may be provided in each of N divided regions of the first active region in a direction perpendicular to a boundary between the first region and the second region, and at least two of the four or more second source electrodes may be provided in each of N divided regions of the second active region in a direction perpendicular to the boundary between the first region and the second region, the N being an integer greater than or equal to 2.

With this configuration, a current can be passed by uniformly utilizing the first and second active regions over the entire regions, which is useful for reduction of ON resistance.

Also, an aspect ratio obtained by dividing a length of the semiconductor device in a direction parallel to a boundary between the first region and the second region by a width of the semiconductor device in a direction perpendicular to the boundary may be greater than 1.

With this configuration, the path of a current which flows through the first metal oxide semiconductor transistor and the second metal oxide semiconductor transistor becomes wider and shorter, which is useful for reduction of ON resistance.

Hereinafter, a semiconductor device according to the present disclosure will be specifically described with reference to the drawings.

It is to be noted that each of the embodiments described below illustrates a specific example of the present disclosure. The numerical values, shapes, materials, components, arrangement positions and topologies of the components that are depicted in the following embodiments are just examples, and are not intended to limit the scope of the present disclosure. Those components in the following embodiments, which are not stated in the independent claim that defines the most generic concept are each described as an arbitrary component.

Embodiment 1

A semiconductor device according to a first embodiment is a CSP semiconductor device, and a first region and a second region obtained by dividing the semiconductor device into halves are provided with the first semiconductor device and the second semiconductor device, respectively. The first semiconductor device and the second semiconductor device each have multiple electrodes at the described-later arrangement positions for improving the electrical characteristics and reliability of mounting.

FIG. 1 is a perspective view illustrating an example of the external appearance of the semiconductor device according to the first embodiment. As illustrated in FIG. 1, the first region and the second region obtained by dividing semiconductor device 1 into halves are respectively provided with transistor 10 and transistor 20 composed of metal oxide semiconductor.

Transistor 10 is, for instance, a metal oxide semiconductor transistor, and has source electrode 11 connected to the source potential, and gate electrode 12 connected to the gate potential. Here, source electrode 11 and gate electrode 12 are examples of the first source electrode and the first gate electrode, respectively. Source electrode 11 is provided in the path for a source current which is the main current of transistor 10, and gate electrode 12 is provided in the path for a gating signal which is a control signal of the source current.

Transistor 20 is, for instance, a metal oxide semiconductor transistor, and has source electrode 21 connected to the source potential, and gate electrode 22 connected to the gate potential. Here, source electrode 21 and gate electrode 22 are examples of the second source electrode and the second gate electrode, respectively. Source electrode 21 is provided in the path for a source current which is the main current of transistor 20, and gate electrode 22 is provided in the path for a gating signal which is a control signal of the source current.

The drain of transistor 10 and the drain of transistor 20 are connected by a conductor (not illustrated) provided on the opposite major surface of source electrodes 11, 21 and gate electrodes 12, 22.

Here, source electrodes 11, 21 and gate electrodes 12, 22 are each a conductor referred to as a terminal, a pad, or a land, and is exposed to the external appearance of semiconductor device 1, and is intended to serve as a conductor used for electrical connection and mechanical fixation to the main substrate by soldering. Transistors 10, 20 are not provided with an electrode connected to a potential other than respective source potential and gate potential.

Figure 2:
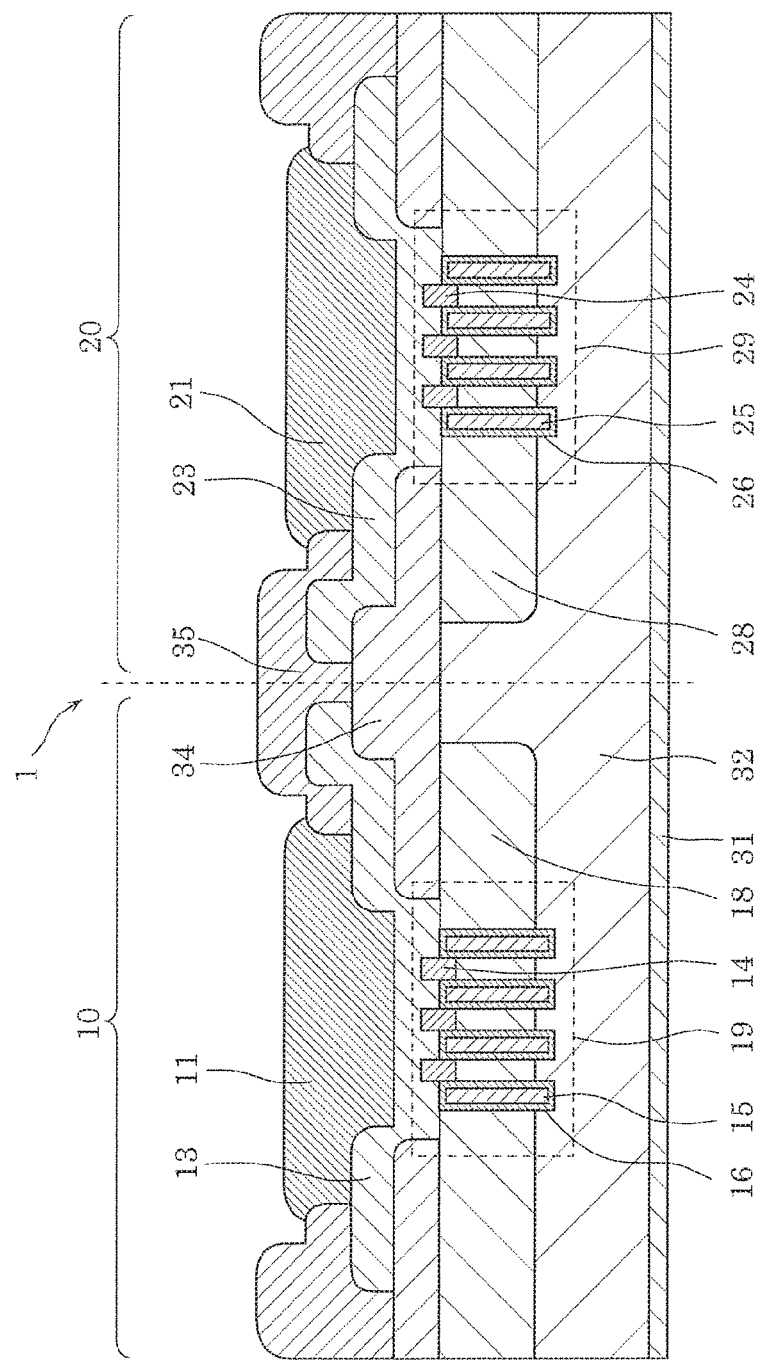
FIG. 2 is a sectional view illustrating an example of the configuration of a bidirectional transistor according to the first embodiment.

FIG. 2 is a sectional view illustrating an example of the configuration of semiconductor device 1, and illustrates II-II section of FIG. 1. As illustrated in FIG. 2, semiconductor device 1, drain region 32 and current control regions 18, 28 are formed, gate conductors 15, 25 and gate insulating films 16, 26 are embedded, and source regions 14, 24 are formed in a substrate composed of a metal oxide semiconductor. Current control regions 18, 28 are separated by drain region 32. Gate conductors 15, 25 are respectively connected to gate electrodes 12, 22 of FIG. 1 in a section other than FIG. 2. Also, drain conductor 31 connected to drain region 32 is provided.

Current control regions 18, 28 are covered by interlayer insulation layer 34 having an opening, and source conductors 13, 23 connected to source regions 14, 24 through the opening of interlayer insulation layer 34 are provided. Interlayer insulation layer 34 and source conductors 13, 23 are covered by passivation layer 35 having an opening, and source electrodes 11, 21 connected to source conductors 13, 23, respectively through the opening of passivation layer 35 are provided.

Channels are formed in the vicinity of gate insulating films 16, 26 of current control regions 18, 28 according to a potential applied to gate conductors 15, 25, and transistors 10, 20 are made conductive. A hereinafter, the region in which the channel of transistors 10 and 20 is formed is referred to as active regions 19 and 29, respectively. Here, active region 19 and active region 29 are examples of the first active region and the second active region, respectively.

Figure 3:
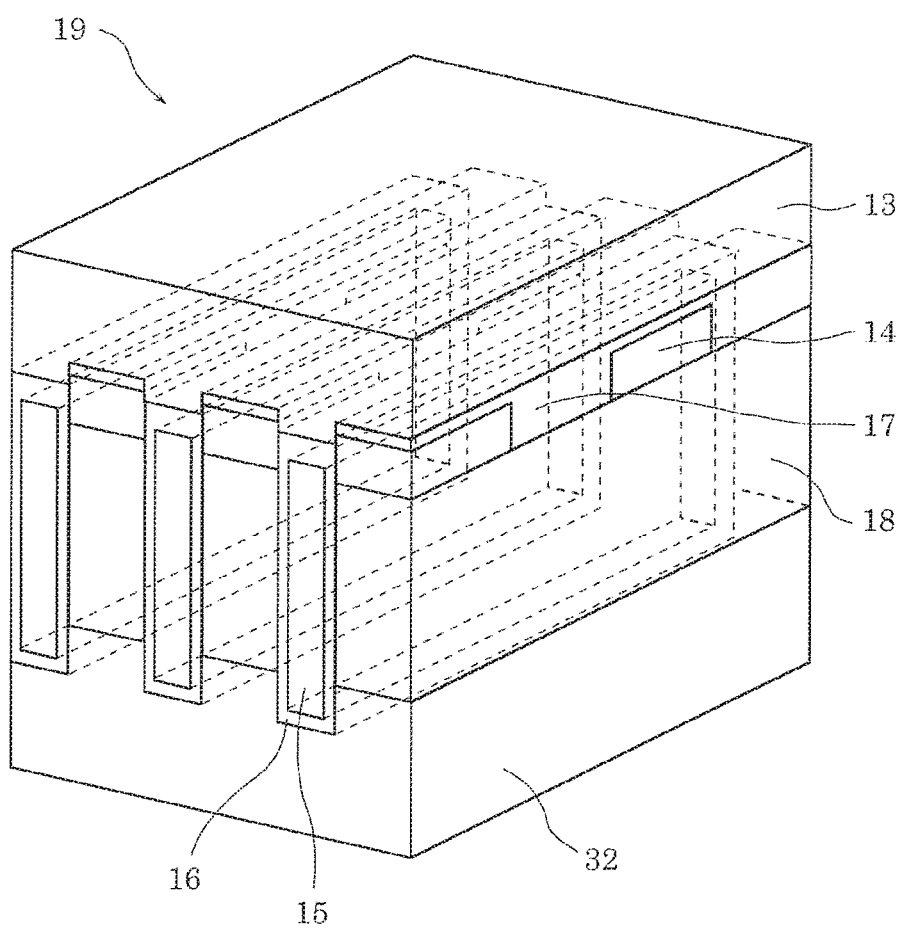
FIG. 3 is a perspective view illustrating an example of the configuration of a bidirectional transistor according to the first embodiment.

FIG. 3 is a perspective view illustrating an example of detailed configuration of active region 19. FIG. 3 illustrates body contact 17. A body diode is formed by bonding between body contact 17 and source region 14. Similar body diode is also formed in active region 29.

With such a configuration, semiconductor device 1 serves as a bidirectional transistor. Hereinafter, the bidirectional transistor comprised of semiconductor device 1 is referred to as bidirectional transistor 1 using the same symbol.

Figure 4A:
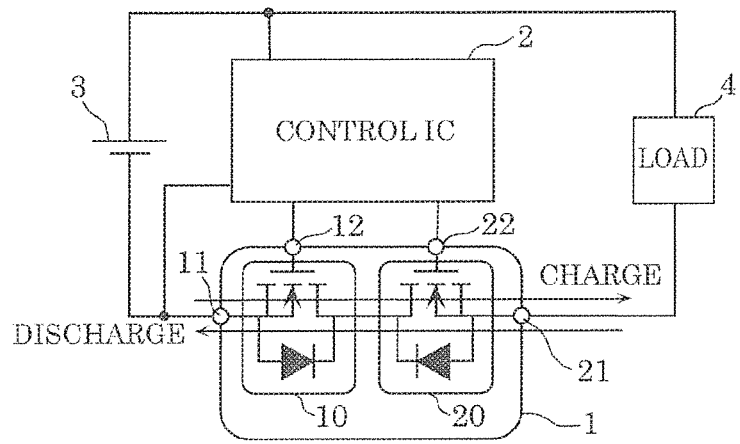
FIG. 4A is a circuit diagram illustrating an example of use of the bidirectional transistor according to the first embodiment.

FIG. 4A is a circuit diagram illustrating an example of application to a charge-and-discharge circuit of bidirectional transistor 1. In the example of application of FIG. 4A, bidirectional transistor 1 controls discharge from battery 3 to load 4 and charge from load 4 to battery 3 according to a control signal given from control IC2.

Figure 4B:
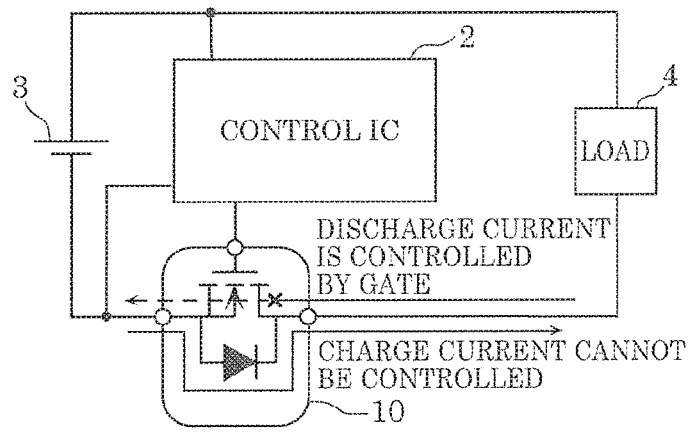
FIG. 4B is a circuit diagram illustrating an example of use of an unidirectional transistor according to a comparative example.

FIG. 4B is a circuit diagram when a similar application example is implemented by only unidirectional transistor 10. In FIG. 4B, a discharge current can be stopped by setting transistor 10 to an OFF state, however, a charge current cannot be stopped because the charge current flows through the above-described body diode in a forward direction even when transistor 10 is set to an OFF state. Thus, a bidirectional transistor is necessary to enable complete current cut off in both directions for discharge and charge.

Figure 4C:
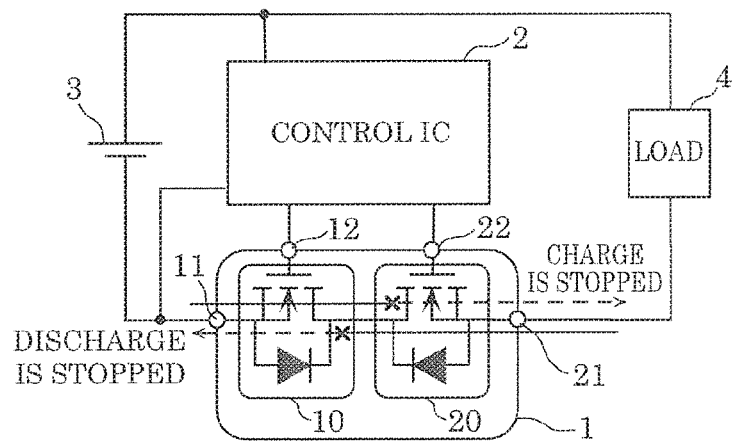
FIG. 4C is a circuit diagram illustrating an example of use of the bidirectional transistor according to the first embodiment.

FIG. 4C is again a circuit diagram illustrating an example of application of FIG. 4A. As illustrated in FIG. 4C, the discharge current is cut off by setting transistor 10 to an OFF state, and the charge current is cut off by setting transistor 20 to an OFF state.

Hereinafter, arrangement positions of source electrodes 11, 21 and gate electrodes 12, 22 in bidirectional transistor 1 will be described in detail.

Figure 5:
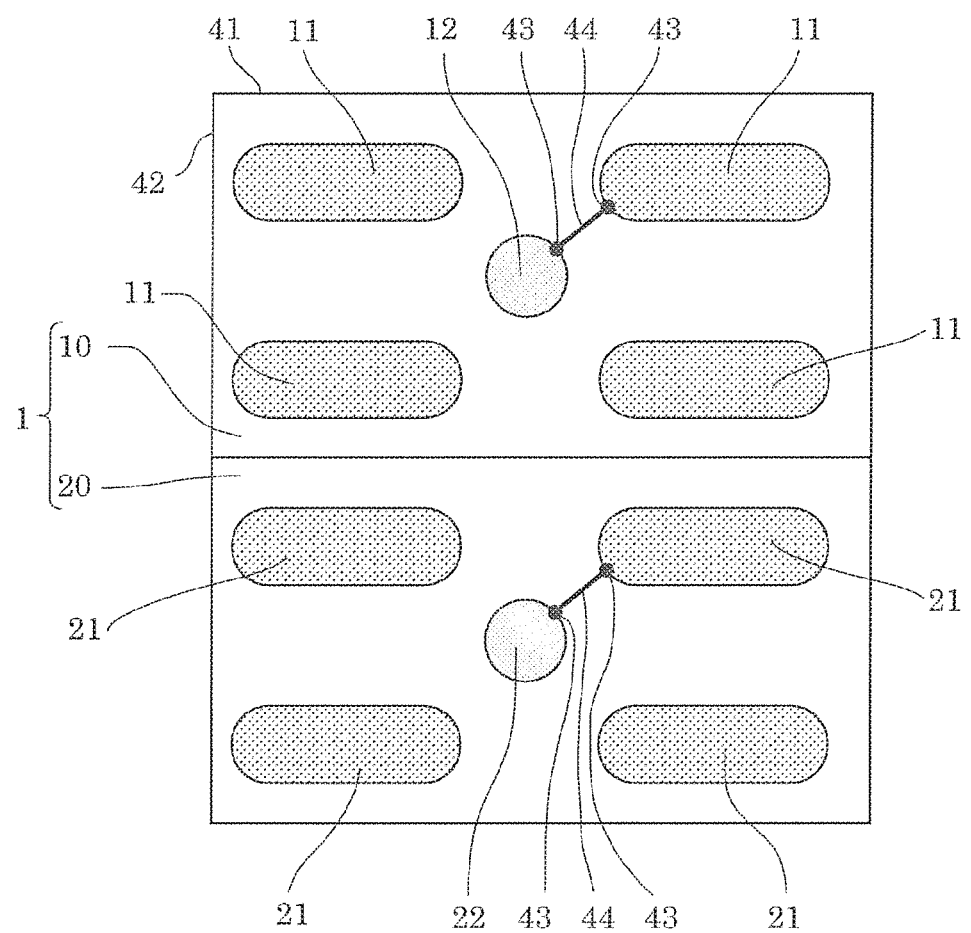
FIG. 5 is an top view illustrating an example of an electrode arrangement according to the first embodiment.

FIG. 5 is a top view illustrating an example of the electrode arrangement of bidirectional transistor 1. As illustrated in FIG. 5, transistor 10 is provided with four source electrodes 11 and one gate electrode 12. In transistor 10, for any combination of source electrode 11 and gate electrode 12, closest points 43 between source electrode 11 and gate electrode 12 are on line 44 that is inclined with respect to chip sides 41, 42. In short, source electrode 11 and gate electrode 12 are diagonally disposed.

Similarly, transistor 20 is provided with four source electrodes 21 and one gate electrode 22. In transistor 20, for any combination of source electrode 21 and gate electrode 22, closest points 43 between source electrode 21 and gate electrode 22 are on line 44 that is inclined with respect to chip sides 41, 42. In short, source electrode 21 and gate electrode 22 are diagonally disposed.

The effect achieved by in such arrangement positions of source electrodes 11, 21 and gate electrodes 12, 22 will be described based on comparison with a comparative example.

Figure 6A:
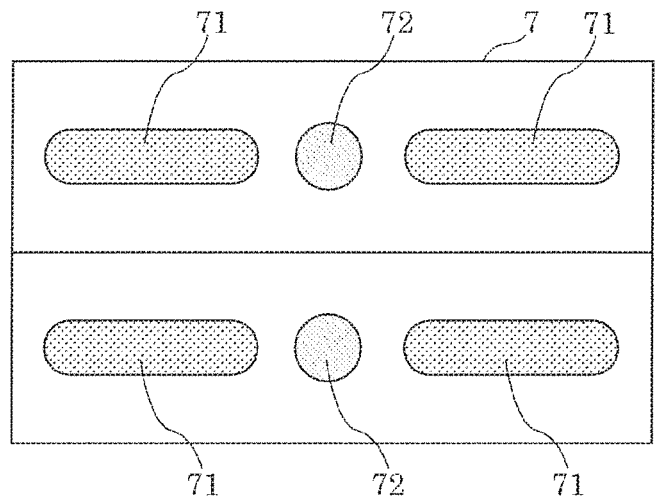
FIG. 6A is an top view illustrating an example of an electrode arrangement according to a comparative example.

FIG. 6A is a top view illustrating an example of an electrode arrangement according to a comparative example. FIG. 6A illustrates the electrode arrangement positions, studied initially by the inventors, for source electrodes 71 and gate electrode 72 of bidirectional transistor 7. In bidirectional transistor 7, source electrodes 71 and gate electrode 72 are disposed on a line parallel to a chip side.

The area of source electrode 71 is increased in order to reduce ON resistance for bidirectional transistor 7.

Figure 6B:
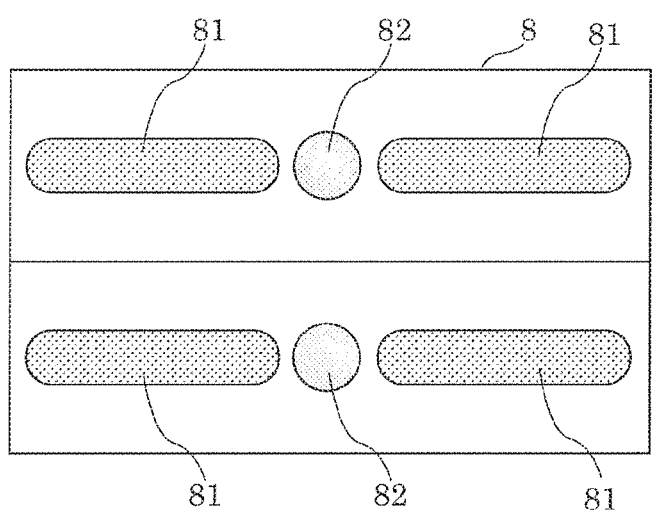
FIG. 6B is an top view illustrating an example of an electrode arrangement according to the comparative example.

FIG. 6B is a top view illustrating an example of an electrode arrangement according to a comparative example. In bidirectional transistor 8 of FIG. 6B, the area of source electrode 81 is increased by extending source electrode 81 in a longitudinal direction. With the arrangement positions, spacing distance between source electrode 81 and gate electrode 82 is decreased, and the possibility of short-circuit between source electrode 81 and gate electrode 82 is increased.

Figure 6C:
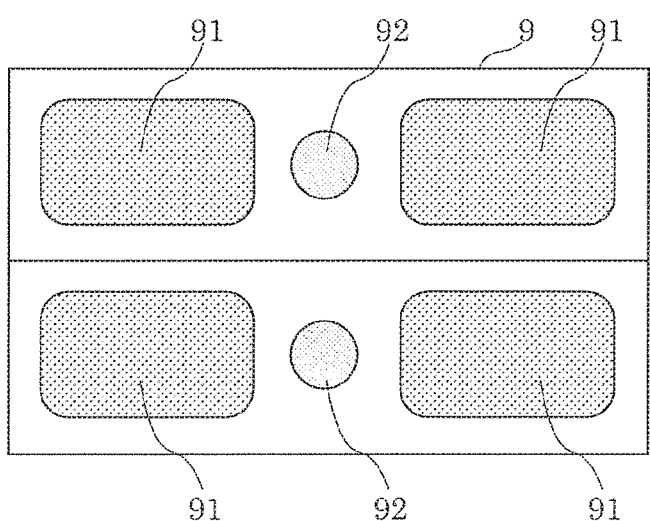
FIG. 6C is an top view illustrating an example of an electrode arrangement according to the comparative example.

FIG. 6C is a top view illustrating an example of an electrode arrangement according to a comparative example. In bidirectional transistor 9 of FIG. 6C, the area of source electrode 91 is increased by extending source electrode 91 in a transverse direction. With the arrangement positions, spacing distance between source electrode 91 and gate electrode 92 is maintained, whereas the width of source electrode 91 is increased, and when source electrode 91 is soldered, void is likely to occur.

Thus, as illustrated in FIG. 5, closest points 43 between source electrode 11 and gate electrode 12 are disposed on line 44 that is inclined with respect to chip sides 41, 42, thereby increasing the area of source electrode 11 and reducing the possibility of short-circuit and occurrence of void.

Figure 7:
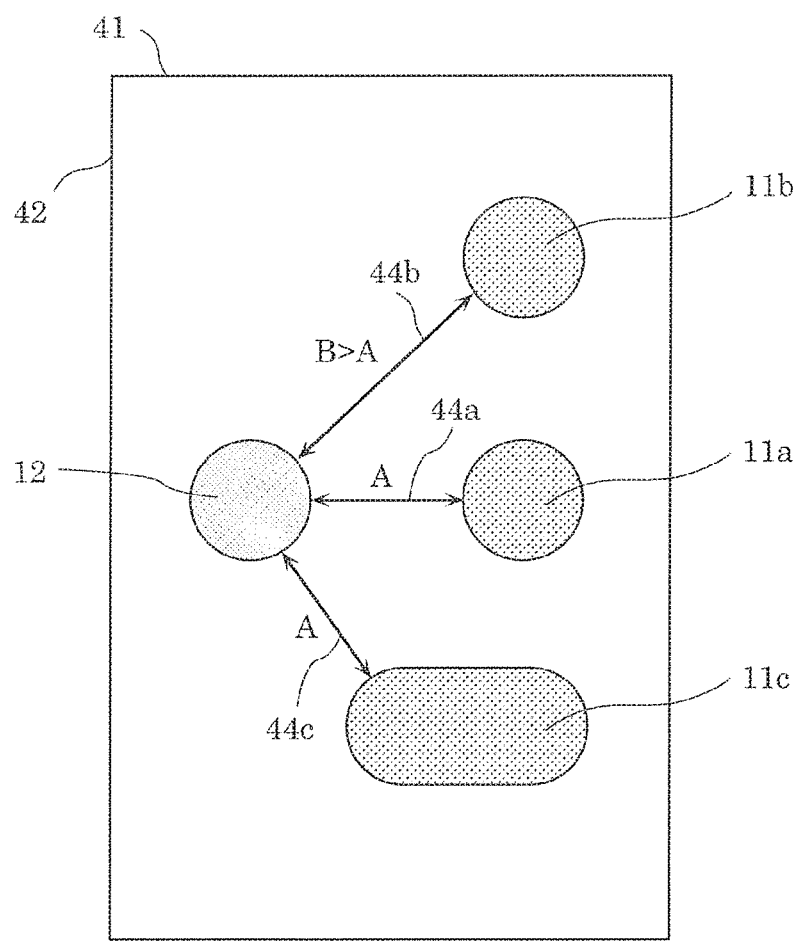
FIG. 7 is a plan view illustrating the effect of an electrode arrangement according to the first embodiment.

FIG. 7 is a figure for explaining the effect achieved by the arrangement position of FIG. 5. For comparison, FIG. 7 illustrates source electrode 11a for which the closest points with gate electrode 12 are on line 44a parallel to chip side 41, and which is disposed away from gate electrode 12 by distance A.

In contrast, source electrode 11b is disposed at a position for which the closest points with gate electrode 12 are disposed on line 44b that is inclined with respect to chip sides 41, 42. Thus, when source electrode 11a and source electrode 11b have the same size, source electrode 11b can be spaced away by distance B which is longer than distance A from gate electrode 12 while maintaining clearance from each chip side. Therefore, source electrode 11b has a higher effect on short-circuit protection than source electrode 11a.

Also, source electrode 11c is disposed at a position for which the closest points with gate electrode 12 are disposed on line 44c that is inclined with respect to chip sides 41, 42. Thus, when the space to gate electrode 12 is the same distance A between source electrode 11a and source electrode 11c, source electrode 11c greater than source electrode 11a can be provided while maintaining clearance from each chip side. Therefore, ON resistance can be more reduced in source electrode 11c than in source electrode 11a.

The inventors have verified the effect of reduction in ON resistance based on the simulation of current distribution that flows through the bidirectional transistor. Hereinafter, the result of the simulation will be described.

Figure 8A:
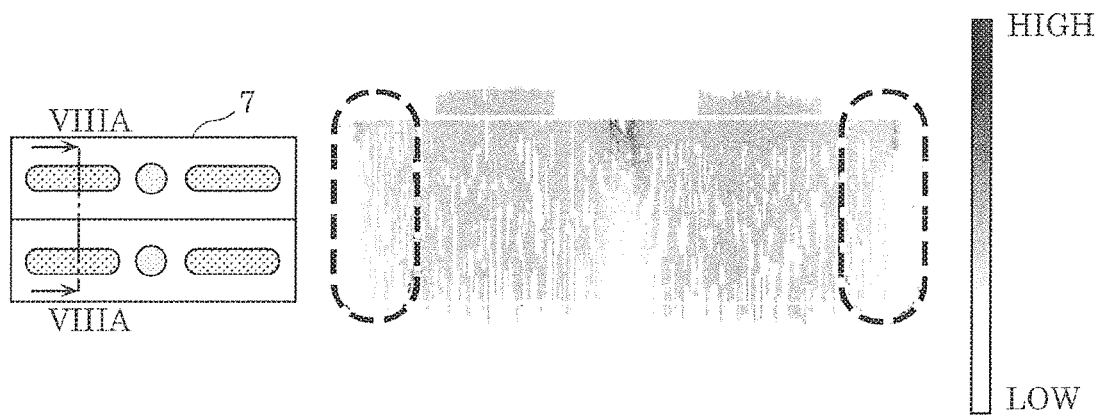
FIG. 8A is a diagram illustrating an example of current distribution in a bidirectional transistor according to a comparative example.
Figure 8B:
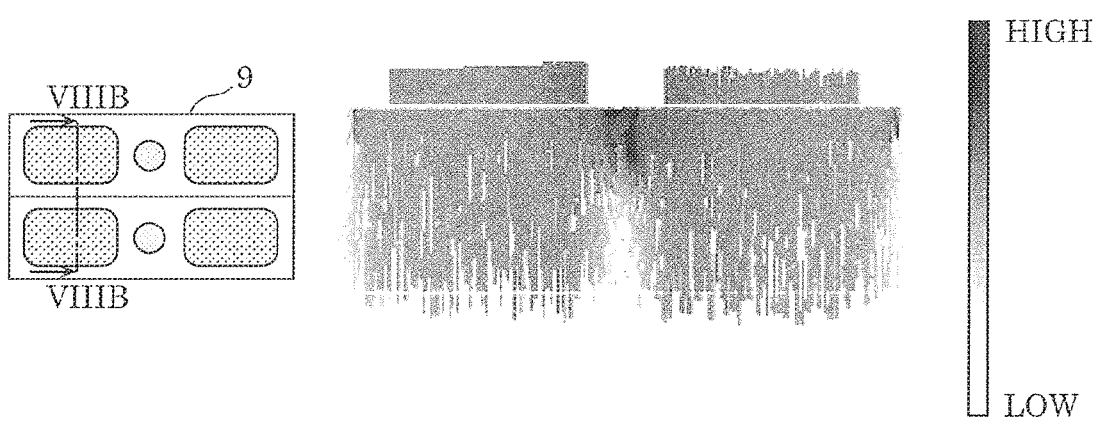
FIG. 8B is a diagram illustrating an example of current distribution in a bidirectional transistor according to the comparative example.
Figure 8C:
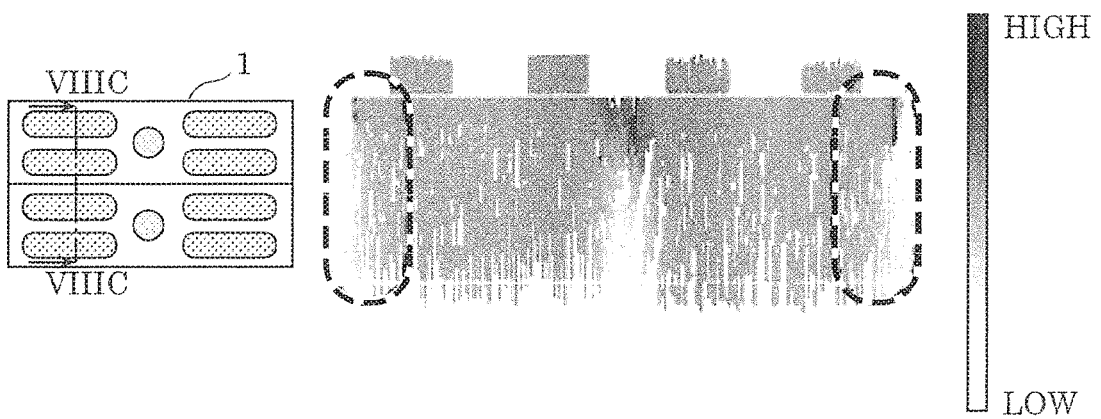
FIG. 8C is a diagram illustrating an example of current distribution in the bidirectional transistor according to the first embodiment.

FIGS. 8A, 8B, and 8C are diagrams illustrating the simulation results of current distribution that flows through VIIIA-VIIIA section of bidirectional transistor 7, VIIIB-VIIIB section of bidirectional transistor 9, and VIIIC-VIIIC section of bidirectional transistor 1, respectively. In FIGS. 8A, 8B, and 8C, each section having a higher current density is illustrated with a thicker color.

The current density in bidirectional transistor 9 with wider source electrodes provided in FIG. 8B is overall higher than the current density in bidirectional transistor 7 in FIG. 8A. Also, the current density in bidirectional transistor 1 in FIG. 8C is approximately the same magnitude as the current density in bidirectional transistor 9 in FIG. 8B because two source electrodes are disposed at positions corresponding to both ends of the wide source electrodes of bidirectional transistor 9. Also, from comparison between the dashed line frames of FIG. 8A and FIG. 8C, a higher current density is obtained up to the circumferential edge in bidirectional transistor 1 than in bidirectional transistor 7.

It is found from this result that with the arrangement position of the source electrodes of bidirectional transistor 1, an increase in the current density (that is, a reduction in the ON resistance) approximately equal to the increase in the current density in bidirectional transistor 9 with wider source electrodes provided in FIG. 8B can be achieved without increasing the possibility of occurrence of void. It is to be noted that the relationship between the width of the source electrode and void will be described in detail later.

Embodiment 2

In the first embodiment, the effect of improvement on the electrical characteristics and reliability of mounting of the semiconductor device achieved by the arrangement position of electrodes has been described using specific examples of bidirectional transistor 1. However, the effect is not limited to bidirectional transistor 1. Since the effect is achieved by characteristic arrangement positions of electrodes regardless of the function of the semiconductor device, the effect can be widely obtained by a CSP semiconductor device, such as a unidirectional transistor and a diode other than a bidirectional transistor.

Therefore, the following semiconductor device is included in the present disclosure: a CSP semiconductor device including multiple electrodes connected to at most two types of potentials, and for any combination of the first electrode connected to the first potential and the second electrode connected to the second potential among the multiple electrodes, the closest points between the first electrode and the second electrode are on a line inclined with respect to a chip side.

In the second embodiment, the arrangement position of the electrodes applied to a CSP semiconductor device will be described in detail.

Figure 9A:
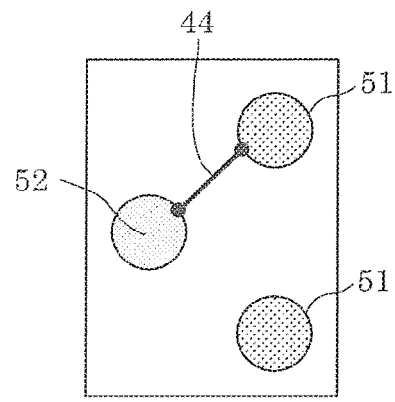
FIG. 9A is an top view illustrating an example of an electrode arrangement according to a second embodiment.
Figure 9B:
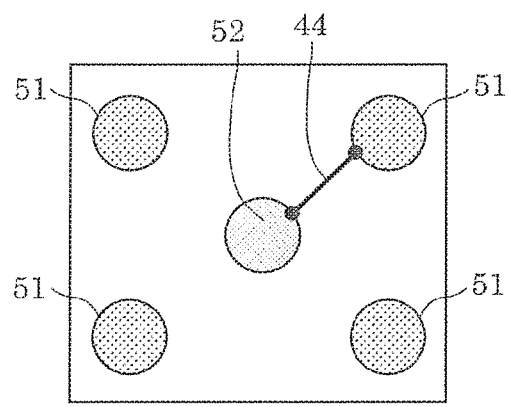
FIG. 9B is an top view illustrating an example of the electrode arrangement according to the second embodiment.
Figure 9C:
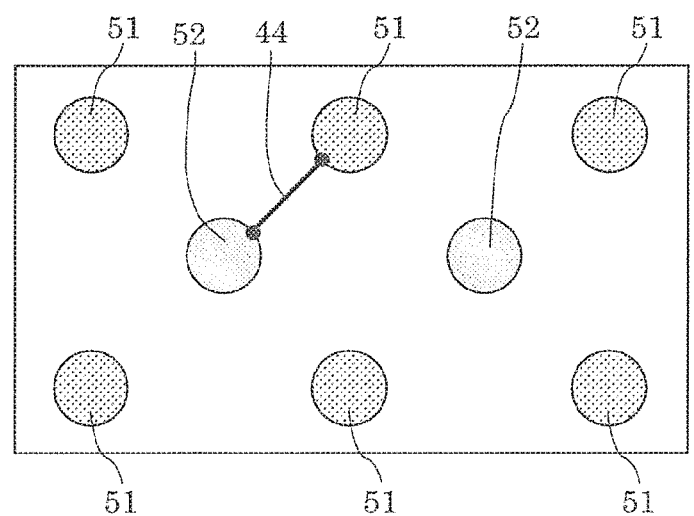
FIG. 9C is an top view illustrating an example of the electrode arrangement according to the second embodiment.

FIGS. 9A, 9B, and 9C are each a top view illustrating an example of arrangement of first electrode 51 and second electrode 52 of a semiconductor device. As illustrated in FIGS. 9A, 9B, and 9C, for any combination of first electrode 51 and second electrode 52, the closest points between first electrode 51 and second electrode 52 are on line 44 inclined with respect to a chip side. The number of first electrodes 51 and the number of second electrodes 52 are not particularly limited. As illustrated in FIG. 9C, multiple second electrode 52 may be provided.

With such arrangement positions, as described above, the spacing distance between first electrode 51 and second electrode 52 can be increased, as compared with the case where the closest points between first electrode 51 and second electrode 52 are on a line parallel to a chip side, and thus the possibility of short-circuit is reduced. In addition, greater electrodes can be provided by maintaining the spacing distance between first electrode 51 and second electrode 52, and thus the connection resistance of each electrode can be reduced.

Also, each of first electrodes 51 may be provided within a stripe-shaped region having a width of a certain value or less in top view.

Figure 10A:
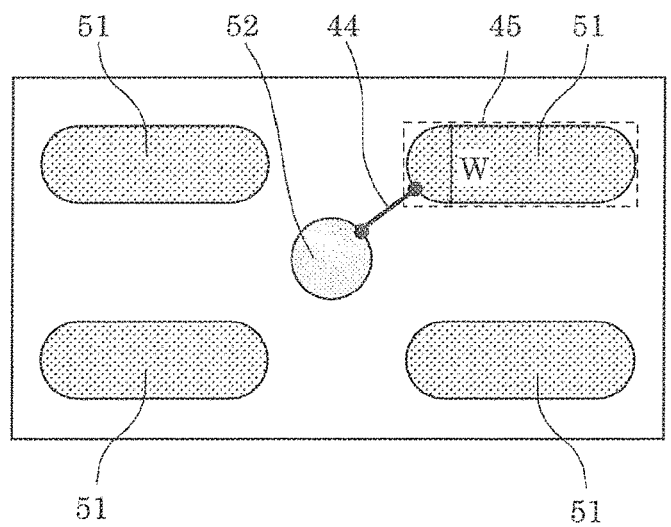
FIG. 10A is an top view illustrating an example of the electrode arrangement according to the second embodiment.
Figure 10B:
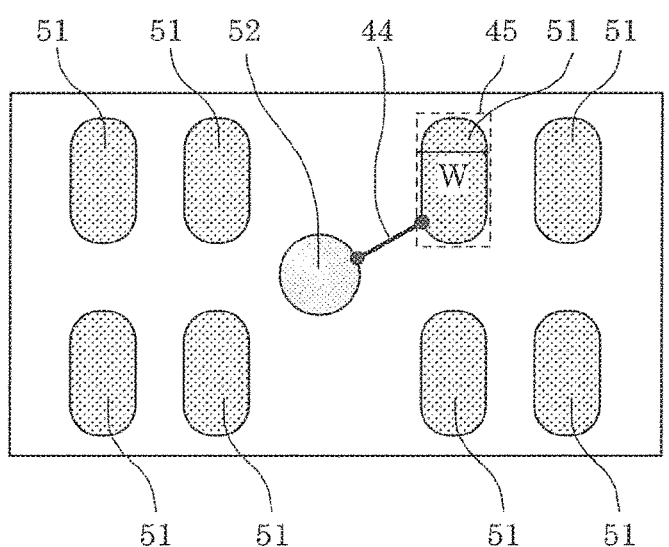
FIG. 10B is an top view illustrating an example of the electrode arrangement according to the second embodiment.
Figure 10C:
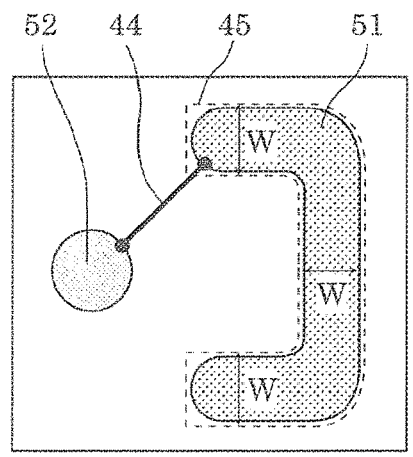
FIG. 10C is an top view illustrating an example of the electrode arrangement according to the second embodiment.

FIGS. 10A, 10B, and 10C are each a top view illustrating an example of arrangement of first electrode 51 and second electrode 52 of such a semiconductor device. As illustrated in FIGS. 10A, 10B, and 10C, first electrode 51 is provided within stripe-shaped region 45 having width w. The shape of stripe-shaped region 45 is not particularly limited. As illustrated in FIG. 10C, the shape may be bent or meandering.

With this arrangement positions, when first electrode 51 is formed in an elongated shape, the width in a transverse direction can be reduced to width w or less, and thus when a semiconductor device is mounted, void is unlikely to occur in first electrode 51.

The inventors have found by original experiments that a preferable upper limit of width w is 250 μm. In the experiments, a predetermined number of circular electrodes with diameters of 250 μm, 350 μm, and 450 μm were prepared, solder was actually reflowed over the electrodes, and an occurrence state of void was observed. The number of electrodes was summed for each of ratios (hereinafter a void area ratio) of the area of void to the area of an electrode.

Figure 11:
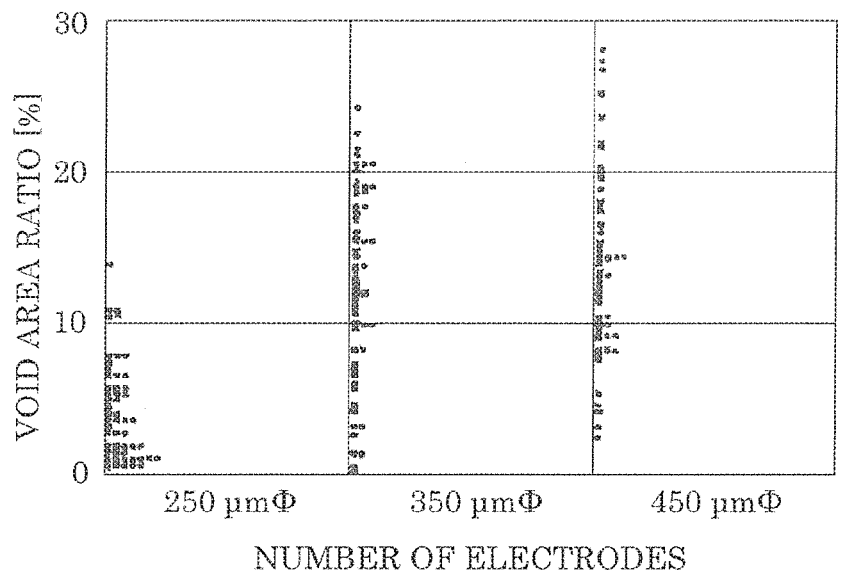
FIG. 11 is a graph illustrating an example of relationship between electrode size and void area ratio.

FIG. 11 is a frequency distribution graph illustrating the number of electrodes for each void area ratio for the electrodes with diameters of 250 μm, 350 μm, and 450 μm. As sees from FIG. 11, an electrode having a lower void area ratio is likely to appear for a smaller electrode size. For substantially all circular electrodes with a diameter of 250 μm, the void area ratio was 12% or less.

From this result, in order to reduce the occurrence of void in first electrode 51 when mounted, it is effective to provide first electrode 51 within stripe-shaped region 45 having a width of 250 μm or less.

It is to be noted that a preferable lower limit is available for the width of first electrode 51. This is because if first electrode 51 is too thin, a solder paste cannot be appropriately printed by stencil printing.

The inventors have found by original experiments that a preferable lower limit of the width of first electrode 51 to appropriately print a solder paste is 170 μm. In the experiments, stencils with multiple thicknesses were provided with circular openings with multiple diameters, a solder paste was actually printed with multiple stencils, and a printed state of the solder paste was observed. Then, an occurrence condition of a problem (hereinafter referred to as solder paste remaining) such that the solder paste remains in the stencil and printing cannot be made appropriately was verified.

Figure 12:
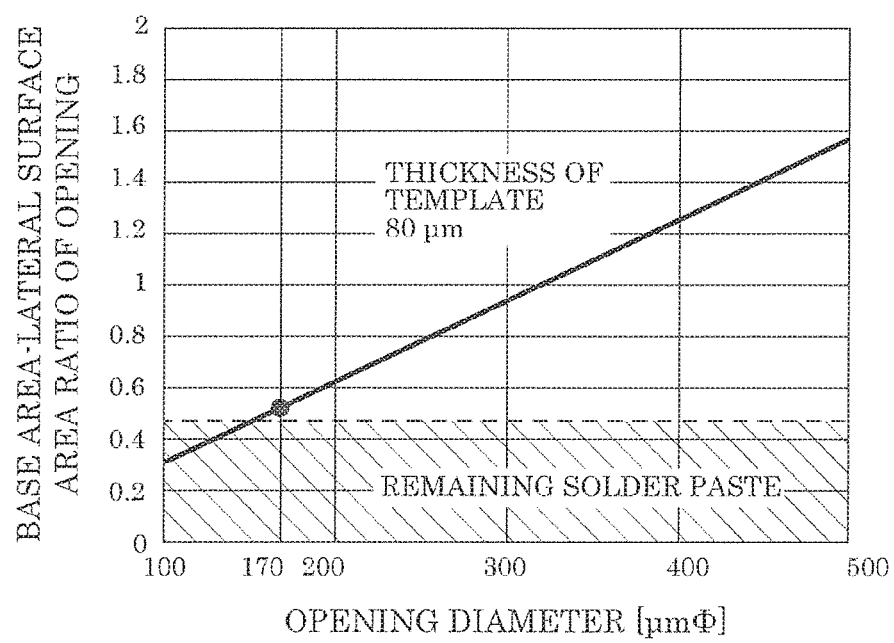
FIG. 12 is a graph illustrating an example of application conditions for solder paste.

FIG. 12 is a graph illustrating an occurrence condition of the solder paste remaining, and the horizontal axis indicates the opening diameter, and the vertical axis indicates a value (hereinafter, an area ratio) obtained by dividing the lateral area by the base area of an opening. It was verified that the solder paste remaining is not dependent on the opening diameter, and is likely to occur when the area ratio is 0.5 or low. The oblique line in FIG. 12 represents the relationship between the opening diameter and the area ratio when a standard stencil having a thickness of 80 μm was used. It is found that with a stencil having a thickness of 80 μm, solder paste remaining is likely to occur when the opening diameter is 170 μm or less.

From this result, in order to avoid solder paste remaining, it is effective that the width of first electrode 51 be 170 μm or greater.

The improvement on the electrical characteristics and reliability of mounting of the semiconductor device achieved by the arrangement position of electrodes has been described above using multiple specific examples. However, the effect can be obtained by a combination of the specific examples as needed or a variation with modified specific examples.

Figure 13A:
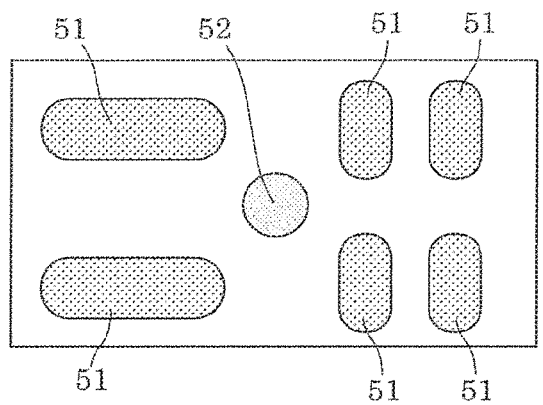
FIG. 13A is an top view illustrating an example of an electrode arrangement according to a variation.
Figure 13B:
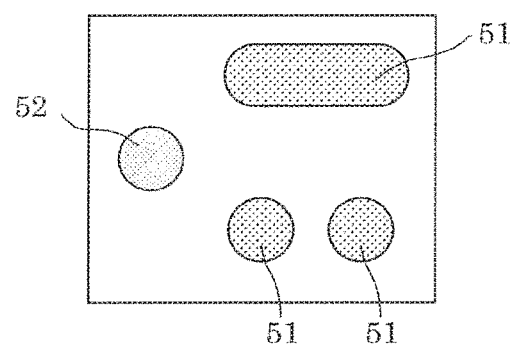
FIG. 13B is an top view illustrating an example of the electrode arrangement according to the variation.
Figure 13C:
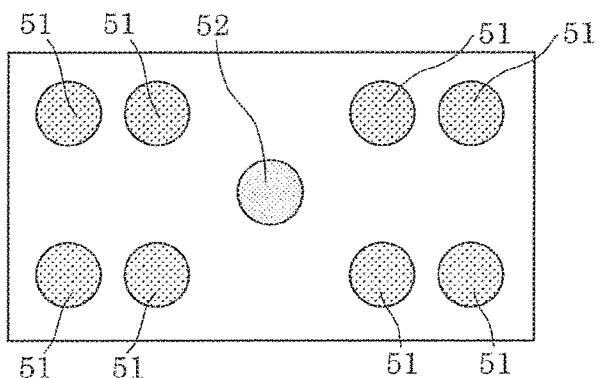
FIG. 13C is an top view illustrating an example of the electrode arrangement according to the variation.
Figure 13D:
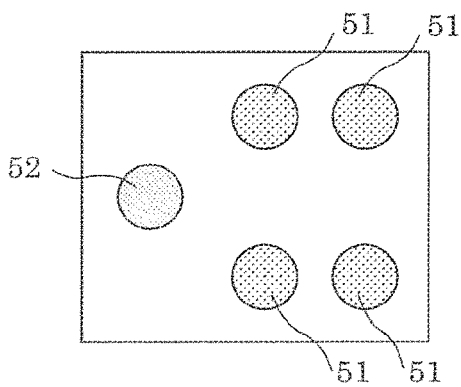
FIG. 13D is an top view illustrating an example of the electrode arrangement according to the variation.

FIGS. 13A, 13B, 13C, and 13D are each a top view illustrating an example of arrangement of first electrode 51 and second electrode 52 of a semiconductor device according to a variation. As illustrated in FIG. 13A, vertically long first electrode 51 and horizontally long first electrode 51 may be mixed, and as illustrated in FIG. 13B, vertically long first electrode 51 and circular first electrode 51 may be mixed. In addition, as illustrated in FIGS. 13C and 13D, a large number of first circular electrodes 51 may be disposed. The effect of improvement on the electrical characteristics and reliability of mounting of the semiconductor device is also achieved by these arrangement positions of electrodes.

In addition, multiple first electrodes 51 may be provided in a path for the main current of the semiconductor device, and one or more second electrodes 52 may be provided in a path for a control signal of the main current. Alternatively, one or more first electrodes 51 may be provided in a path for the main current of the semiconductor device, one or more second electrodes 52 may be provided in a path for a control signal of the main current, and the area (the total value) of first electrodes 51 may be greater than the area of second electrodes 52. Here, according to an example of a transistor, the main current may be a source current, and the control signal may be a gate signal. In other words, first electrode 51 may be a source electrode and second electrode 52 may be a gate electrode.

With this configuration, as compared with the case where the same number of first source electrodes 51 and second electrodes 52 are provided with the same area, the resistance of the path for the main current can be made lower than the resistance of the path for the control signal. Thus, it is possible to optimize the resistance of the path for the main current, for which a current larger than the current of the path for the control signal is assumed to be handled. When the semiconductor device is, for instance, a transistor, these configurations are suitable to reduce the ON resistance of the transistor. When the semiconductor device is a bidirectional transistor, the above-described arrangement positions of electrodes may be applied to each of two transistors included in the bidirectional transistor.

Embodiment 3

In a third embodiment, a positional relationship between a source electrode and an active region for reducing the ON resistance of the bidirectional transistor will be described.

The inventors have performed a simulation for bidirectional transistor 7 which has been shown as a comparative example in the first embodiment, and determined a relationship between spacing distance and ON resistance of source electrodes in the arrangement direction of the transistors. Here, the arrangement direction of the transistors refers to the direction perpendicular to the boundary of the region in which the transistor is provided.

Figure 14:
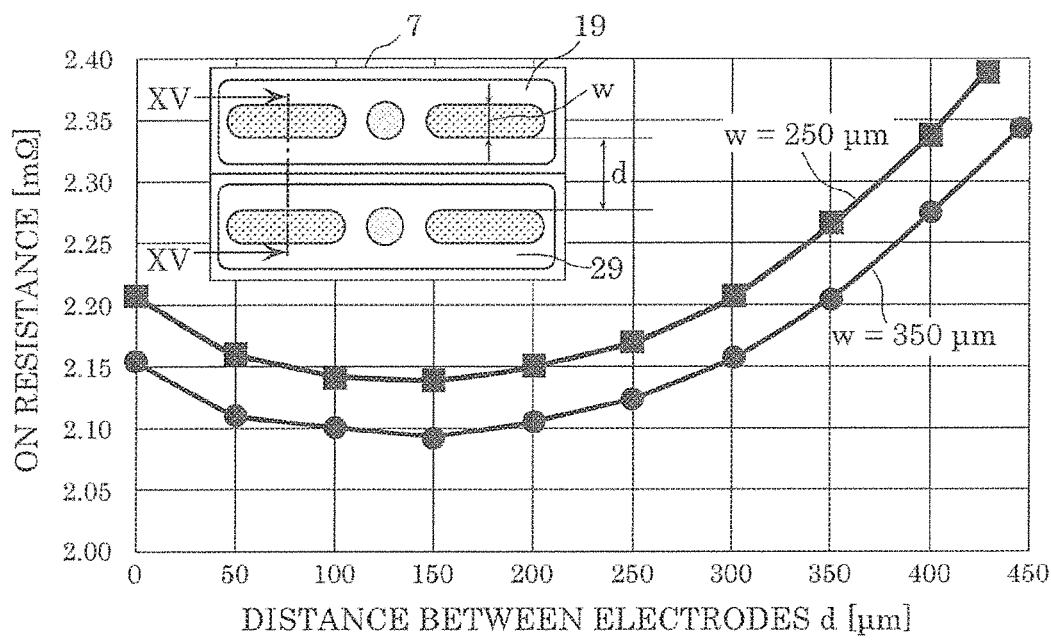
FIG. 14 is a graph illustrating an example of relationship between spacing distance and ON resistance of source electrodes.

FIG. 14 is a graph illustrating a result of simulation when width w of the source electrode are 250 μm and 350 μm, and illustrates an example of relationship between spacing distance d between the source electrodes of two transistors included in bidirectional transistor 7 and the ON resistance of bidirectional transistor 7.

In FIG. 14, the active regions of the transistors in bidirectional transistor 7 are referred to as active regions 19, 29 using the same symbols as those used for bidirectional transistor 1 for the sake of convenience of description. For each case of width w of the source electrode of 250 µm and 350 µm, when spacing distance d between the source electrodes is 150 µm, the source electrode of each transistor is positioned at the center of a corresponding active region in the arrangement direction of the transistors. When spacing distance d between the source electrodes is less than 150 µm, the source electrode of each transistor is positioned inwardly of the center of the active region, that is, positioned on the near side of the other transistor, and when spacing distance d between the source electrodes is greater than 150 µm, the source electrode of each transistor is positioned outwardly of the center of the active region, that is, positioned on the far side of the other transistor.

As sees from FIG. 14, the ON resistance, has a minimum when spacing distance d between is 150 µm. In other words, when the source electrode of each transistor is disposed at the center of the active region in the arrangement direction of the transistors, the ON resistance has a minimum. This result is described as follows.

Figure 15A:
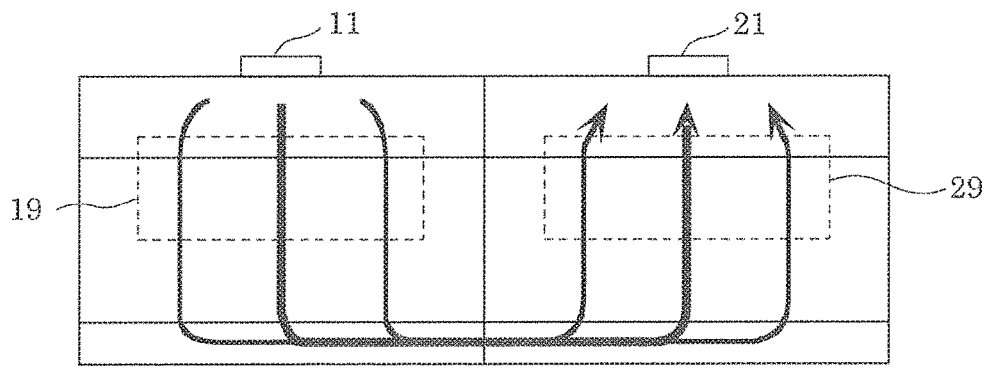
FIG. 15A is a diagram illustrating a mechanism in which ON resistance is varied with an electrode position.
Figure 15B:
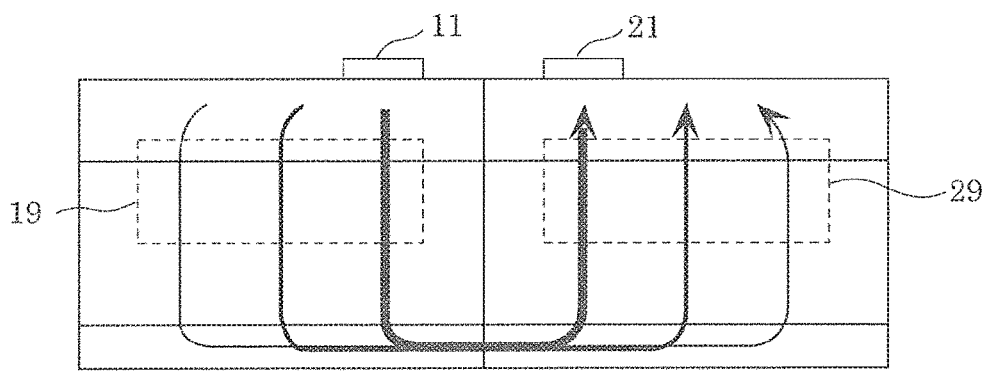
FIG. 15B is a diagram illustrating a mechanism in which ON resistance is varied with an electrode position.

FIGS. 15A and 15B are diagrams illustrating the current path in XV-XV section of bidirectional transistor 7 illustrated in FIG. 14, and schematically illustrate the magnitude of current by the thickness of a line. In FIGS. 15A and 15B, the source electrodes of the transistors in bidirectional transistor 7 are referred to as source electrodes 11, 12 using the same symbols as those used for bidirectional transistor 1 for the sake of convenience of description. As illustrated in FIGS. 15A and 15B, a maximum amount of current flows through the current path directly under source electrodes 11, 21, and for a current path more distance from source electrodes 11, 21, the current amount is decreases probably because of a high resistance. Thus, when the source electrode is disposed at the center of active regions 19, 29, the sum of amounts of current flowing through active regions 19, 29 has a maximum (in other words, the ON resistance has a minimum).

Based on this knowledge, source electrodes 11, 21 of bidirectional transistor 1 according to the first embodiment are disposed at the below-described positions with respect to active regions 19, 29.

Figure 16A:
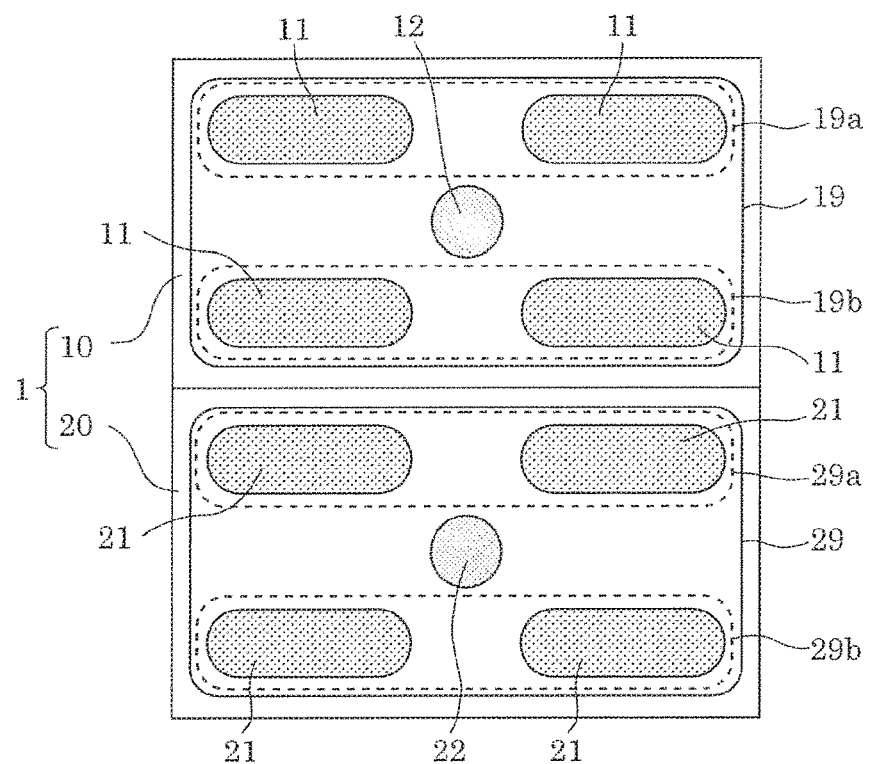
FIG. 16A is an top view illustrating an example of an electrode arrangement according to a third embodiment.

FIG. 16A is a top view illustrating an example of arrangement of source electrodes 11, 21, gate electrodes 12, 22, and active regions 19, 29 of bidirectional transistor 1. The electrode arrangement in FIG. 16A corresponds to the electrode arrangement illustrated in FIG. 5. As illustrated in FIG. 16A, end regions 19a, 29a of active regions 19, 29 in the arrangement direction of transistors 10, 20, and other end regions 19b, 29b are respectively provided with source electrodes 11, 21 two for each. Here, the arrangement direction of transistors 10, 20 may be the direction perpendicular to the boundary of a first region and a second region in which transistors 10, 20 are respectively provided. Also, end regions 19a, 29a and other end regions 19b, 29b may be a portion obtained by excluding from active regions 19, 29 the region overlapping with gate electrode 12 in the arrangement direction of transistors 10, 20.

Also, the number of source electrodes 11, 21 respectively provided in end regions 19a, 29a and other end regions 19b, 29b may be one or may be three or greater.

Figure 16B:
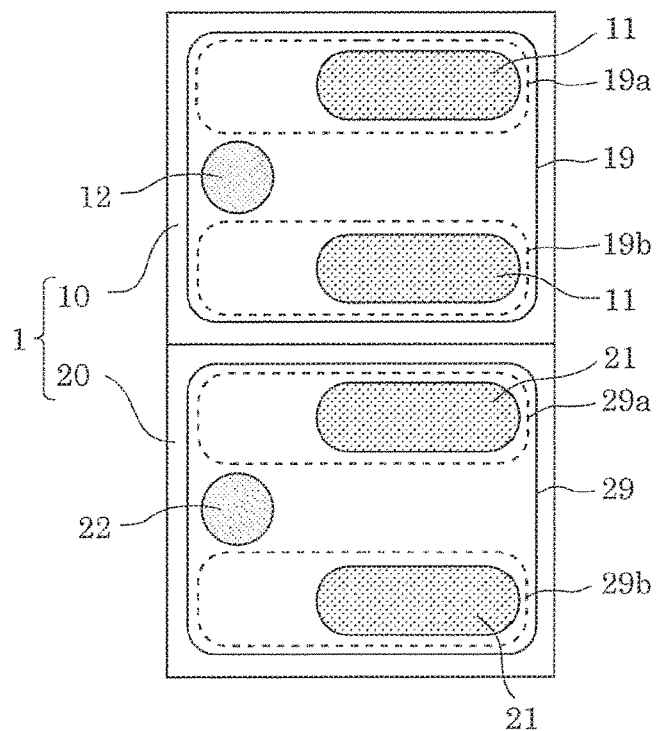
FIG. 16B is an top view illustrating an example of the electrode arrangement according to the third embodiment.

FIG. 16B is a top view illustrating another example of electrode arrangement of bidirectional transistor 1. In FIG. 16B, end regions 19a, 29a and other end regions 19b, 29b are respectively provided with source electrodes 11, 21 one for each.

With this arrangement positions of source electrodes 11, 21, a current can be passed by effectively utilizing active regions 19, 29 up to both ends, which is useful for reduction of the ON resistance.

Also, source electrodes 11, 21 may be disposed in the following manner in order to utilize the active regions effectively.

Figure 17A:
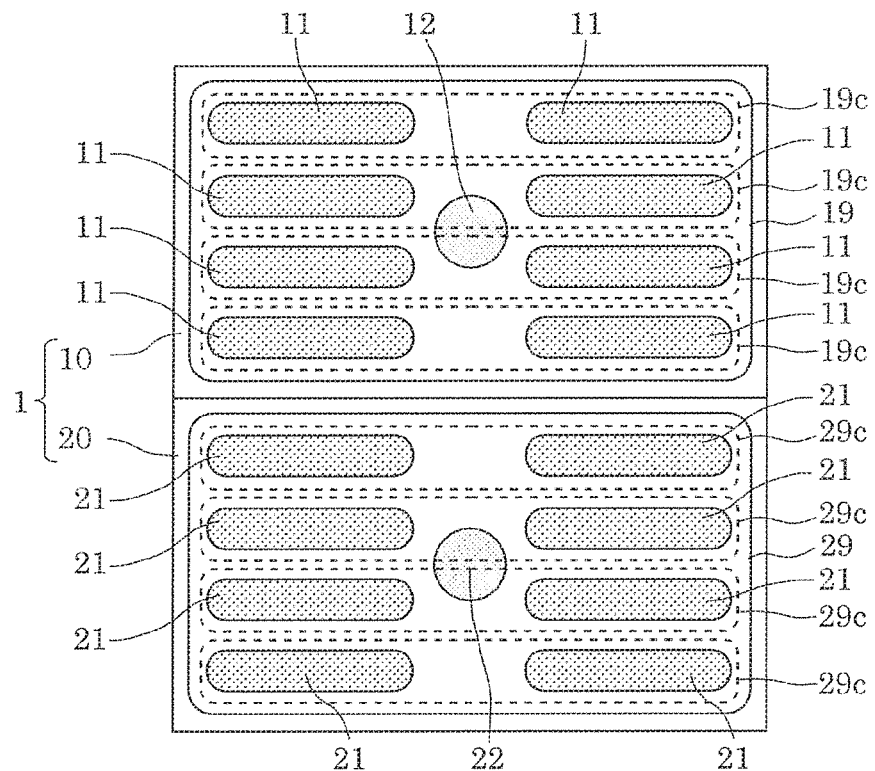
FIG. 17A is an top view illustrating an example of the electrode arrangement according to the third embodiment.

FIG. 17A is a top view illustrating an example of electrode arrangement of bidirectional transistor 1. As illustrated in FIG. 17A, active regions 19, 29 are divided into N parts (N is an integer greater than or equal to 2, quadrisection in the example illustrated) in the arrangement direction of transistors 10, 20, and each of division regions 19c, 29c is respectively provided with source electrodes 11, 21 two for each. Here, the arrangement direction of transistors 10, 20 may be the direction perpendicular to the boundary of the first region and the second region in which transistors 10, 20 are respectively provided.

Also, the number of source electrodes 11, 21 respectively provided in division regions 19c, 29c may be one or may be three or greater.

Figure 17B:
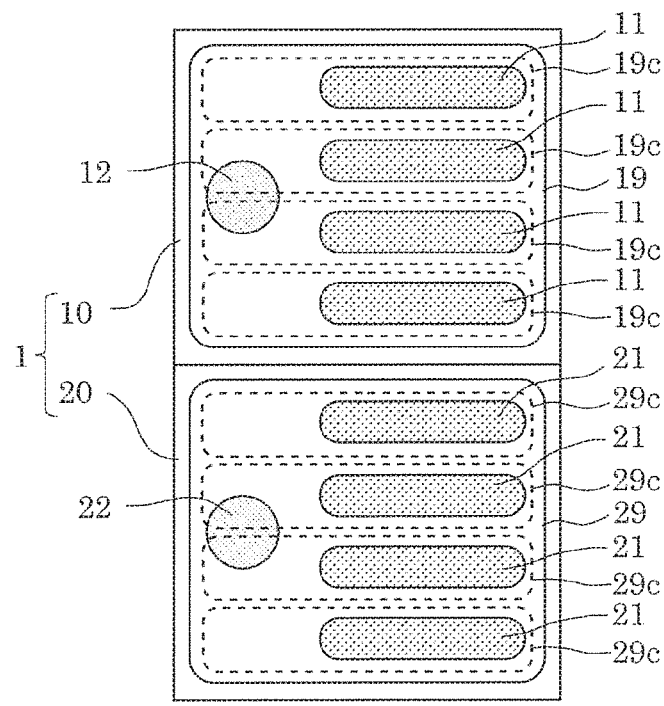
FIG. 17B is an top view illustrating an example of the electrode arrangement according to the third embodiment.

FIG. 17B is a top view illustrating another example of electrode arrangement of bidirectional transistor 1. In FIG. 17B, each of division regions 19c, 29c is provided with source electrodes 11, 21 one for each.

With this arrangement positions of source electrodes 11, 21, a current can be passed by uniformly utilizing active regions 19, 29 over the entire regions, which is useful for reduction of the ON resistance.

Embodiment 4

In a fourth embodiment, an effective chip shape in order to reduce the ON resistance of a bidirectional transistor will be described.

The inventors have performed a simulation for bidirectional transistor 7 which has been illustrated as a comparative example in the first embodiment, and determined a relationship between the chip shape of bidirectional transistor 7 and the ON resistance.

Figure 18:
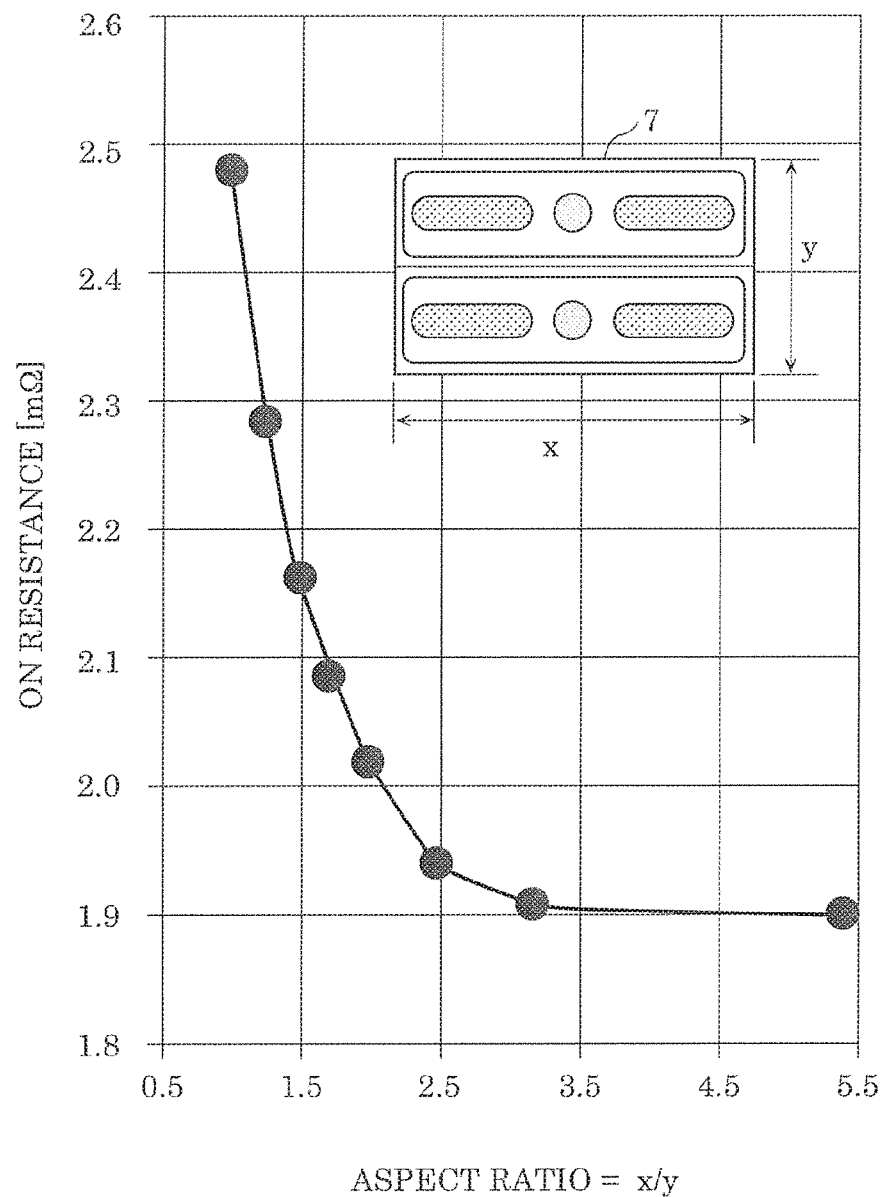
FIG. 18 is a graph illustrating an example of relationship between aspect ratio of the contour of a bidirectional transistor and ON resistance.

FIG. 18 is a graph illustrating a result of the simulation, and illustrates an example of relationship between the aspect ratio of chip shape of bidirectional transistor 7 and the ON resistance. Here, the aspect ratio is a value obtained by dividing length x in the direction parallel to the boundary of the first region and the second region in which transistors of bidirectional transistor 7 are disposed, by width y in the direction perpendicular to the boundary.

As sees from FIG. 18, as the aspect ratio of the chip shape increases, the path for the main current flowing through two transistors becomes wider and shorter, and thus the ON resistance is reduced.

From this result, in order to reduce the ON resistance of bidirectional transistor 7, it is effective to make the aspect ratio of the chip shape higher than 1, in other words, to make a short rectangle chip shape in the arrangement direction of the transistors in bidirectional transistor 7.

A combination of such a chip shape of bidirectional transistor 7 and the above-described arrangement position is applied to bidirectional transistor 1, and thus improved bidirectional transistor 1 for reducing the ON resistance is obtained.

Although the semiconductor device according to one or more aspects of the present disclosure has been described based on the embodiments, the present disclosure is not limited to the embodiments. As long as not departing from the spirit of the present disclosure, modified embodiments obtained by making various modifications, which occur to those skilled in the art, to the present embodiment, and the embodiments that are constructed by combining the components of different embodiments may also be included in the scope of one or more aspects of the present disclosure.

INDUSTRIAL APPLICABILITY

The semiconductor device according to the present disclosure is broadly applicable as a CSP semiconductor device to various semiconductor devices, such as a bidirectional transistor, a unidirectional transistor, and a diode.

What is claimed is:

1. A semiconductor device in a chip size package, comprising
a first metal oxide semiconductor transistor and a second metal oxide semiconductor transistor both vertical transistors respectively formed in a first region and a second region obtained by dividing the semiconductor device into halves,
wherein the first metal oxide semiconductor transistor includes one or more first gate electrodes and four or more first source electrodes provided in one of major surfaces of the semiconductor device, each of the one or more first gate electrodes is surrounded, in top view, by at least four of the four or more first source electrodes, and for any combination of one of the one or more first gate electrodes and one of the four or more first source electrodes, closest points between the one of the one or more first gate electrodes and the one of the four or more first source electrodes are on a first line inclined with respect to a first side of the semiconductor device in top view,
the second metal oxide semiconductor transistor includes one or more second gate electrodes and four or more second source electrodes provided in the one of major surfaces of the semiconductor device, each of the one or more second gate electrodes is surrounded, in top view, by at least four of the four or more second source electrodes, and for any combination of one of the one or more second gate electrodes and one of the four or more second source electrodes, closest points between the one of the one or more second gate electrodes and the one of the four or more second source electrodes are on a second line inclined with respect to a second side of the semiconductor device in top view, and
a conductor that connects a drain of the first metal oxide semiconductor transistor and a drain of the second metal oxide semiconductor transistor is provided in the other of the major surfaces of the semiconductor device, and
the one or more first gate electrodes, the four or more first source electrodes, the one or more second gate electrodes, and the four or more second source electrodes are each exposed in an external appearance of the semiconductor device,
wherein the semiconductor device is a bidirectional transistor in which current flows in both directions between the four or more first source electrodes and the four or more second source electrodes.

2. The semiconductor device according to claim 1,
wherein a first active region of the first metal oxide semiconductor transistor and a second active region of the second metal oxide semiconductor transistor are provided in the first region and the second region, respectively,
at least two of the four or more first source electrodes are provided in each of one end region and the other end region of the first active region in a direction perpendicular to a boundary between the first region and the second region, and
at least two of the four or more second source electrodes are provided in each of one end region and the other end region of the second active region in the direction perpendicular to the boundary.

3. The semiconductor device according to claim 2,
wherein an aspect ratio obtained by dividing a length of the semiconductor device in a direction parallel to the boundary by a width of the semiconductor device in the direction perpendicular to the boundary is greater than 1.

4. The semiconductor device according to claim 1,
wherein a first active region of the first metal oxide semiconductor transistor and a second active region of the second metal oxide semiconductor transistor are provided in the first region and the second region, respectively,
at least two of the four or more first source electrodes are provided in each of N divided regions of the first active region in a direction perpendicular to a boundary between the first region and the second region, and
at least two of the four or more second source electrodes are provided in each of N divided regions of the second active region in the direction perpendicular to the boundary, the N being an integer greater than or equal to 2.

5. The semiconductor device according to claim 4,
wherein an aspect ratio obtained by dividing a length of the semiconductor device in a direction parallel to the boundary by a length of the semiconductor device in the direction perpendicular to the boundary is greater than 1.

6. The semiconductor device according to claim 4,
wherein the four or more first source electrodes the four or more second source electrodes are each provided within a stripe-shaped region having a width of a certain value or less in top view.

7. The semiconductor device according to claim 6,
wherein the certain value is 250 μm.

8. The semiconductor device according to claim 6,
wherein the one or more first gate electrodes, the four or more first source electrodes, the one or more second gate electrodes, and the four or more second source electrodes each have a width of at least 170 μm in top view.

9. The semiconductor device according to claim 6,
wherein, in top view:
two or more of the at least four of the four or more first source electrodes are provided in each of four quadrants around each of the one or more first gate electrodes; and
two or more of the at least four of the four or more second source electrodes are provided in each of four quadrants around each of the one or more second gate electrodes.

10. The semiconductor device according to claim 6, wherein, in top view:
one or more of the at least four of the four or more first source electrodes are provided in each of four quadrants around each of the one or more first gate electrodes, each of the one or more of the at least four of the four or more first source electrodes having an area greater than an area of the first gate electrode; and
one or more of the at least four of the four or more second source electrodes are provided in each of four quadrants around each of the one or more second gate electrodes, each of the one or more of the at least four of the four or more second source electrodes having an area greater than an area of the second gate electrode.

11. The semiconductor device according to claim 10, wherein the four or more first source electrodes and the four or more second source electrodes are each formed in an elongated shape, in top view, longer in the direction perpendicular to the boundary.

12. The semiconductor device according to claim 10, wherein the four or more first source electrodes and the four or more second source electrodes are each formed in an elongated shape, in top view, longer in a direction parallel to the boundary.

13. The semiconductor device according to claim 1, wherein an aspect ratio obtained by dividing a length of the semiconductor device in a direction parallel to a boundary between the first region and the second region by a width of the semiconductor device in a direction perpendicular to the boundary is greater than 1.

14. The semiconductor device according to claim 1, wherein the four or more first source electrodes—and the four or more second source electrodes are each provided within a stripe-shaped region having a width of a certain value or less in top view.

15. The semiconductor device according to claim 14, wherein the certain value is 250 μm.

16. The semiconductor device according to claim 14, wherein the one or more first gate electrodes, the four or more first source electrodes, the one or more second gate electrodes, and the four or more second source electrodes each have a width of at least 170 μm in top view.

17. The semiconductor device according to claim 14, wherein, in top view:
two or more of the at least four of the four or more first source electrodes are, provided in each of four quadrants around each of the one or more first gate electrodes; and
two or more of the at least four of the four or more second source electrodes are provided in each of four quadrants around each of the one or more second gate electrodes.

18. The semiconductor device according to claim 14, wherein, in top view:
one or more of the at least four of the four or more first source electrodes are provided in each of four quadrants around each of the one or more first gate electrodes, each of the one or more of the at least four of the four or more first source electrodes having an area greater than an area of the first gate electrode; and
one or more of the at least four of the four or more second source electrodes are provided in each of four quadrants around each of the one or more second gate electrodes, each of the one or more of the at least four of the four or more second source electrodes having an area greater than an area of the second gate electrode.

19. The semiconductor device according to claim 18, wherein the four or more first source electrodes and the four or more second source electrodes are each formed in an elongated shape, in top view, longer in a direction perpendicular to a boundary between the first region and the second region.

20. The semiconductor device according to claim 18, wherein the four or more first source electrodes and the four or more second source electrodes are each formed in an elongated shape, in top view, longer in a direction parallel to a boundary between the first region and the second region.

* * * * *